US007888716B2

(12) United States Patent
Ichikawa et al.

(10) Patent No.: US 7,888,716 B2
(45) Date of Patent: Feb. 15, 2011

(54) PIXEL STRUCTURE OF SOLID-STATE IMAGE SENSOR

(75) Inventors: Michinori Ichikawa, Tokyo (JP); Takanori Tanite, Tokyo (JP); Tadashi Kawate, Tokyo (JP)

(73) Assignees: Brainvision Inc., Tokyo (JP); Stanley Electric Co., Ltd., Tokyo (JP)

( * ) Notice: Subject to any disclaimer, the term of this patent is extended or adjusted under 35 U.S.C. 154(b) by 33 days.

(21) Appl. No.: 12/216,814

(22) Filed: Jul. 10, 2008

(65) Prior Publication Data

US 2009/0057673 A1 Mar. 5, 2009

(30) Foreign Application Priority Data

Jul. 11, 2007 (JP) .............................. 2007-181696

(51) Int. Cl.
*H01L 31/062* (2006.01)
(52) U.S. Cl. ....................... 257/292; 257/247; 257/291; 257/E27.133
(58) Field of Classification Search ................. 257/247, 257/291, 292, E27.133
See application file for complete search history.

(56) References Cited

U.S. PATENT DOCUMENTS

2006/0214194 A1* 9/2006 Ikeda ........................ 257/215

2007/0176213 A1* 8/2007 Oda .......................... 257/247

FOREIGN PATENT DOCUMENTS

JP 2005-235893 A 9/2005

* cited by examiner

*Primary Examiner*—Tan N Tran
(74) *Attorney, Agent, or Firm*—Birch, Stewart, Kolasch & Birch, LLP

(57) ABSTRACT

To eliminate uneven distribution of electrons caused by variation in threshold voltages of gates for distributing electrons and to have sensitivity in a long wavelength in a pixel structure of a solid-state image sensor of a charge sorting method, the structure has: a photodiode that generates electrons by photoelectric conversion; a plurality of charge-storage sections that store electrons generated in the photodiode; and a gate structure that is arranged between the photodiode and the charge-storage sections and controls transfer of electrons generated in the photodiode to the plurality of charge-storage sections, in which the gate structure is made up of plural stages of gates, and the plural stages of gates at least have: a front stage gate that is arranged adjacent to the photodiode and controls readout of electrons generated in the photodiode; and a rear stage gate that is arranged adjacent to the plurality of charge-storage sections on the rear stage of the front stage gate and performs control of distributing electrons read out by readout control of the front stage gate to the plurality of charge-storage sections.

4 Claims, 11 Drawing Sheets

11: SUB: SUBSTRATE (P−)
12: STI : SEPARATING GROOVE (STI)
13: PD: PHOTODIODE (N+)
14: TG: TRANSFER GATE (poly)
15: DG1: FIRST DISTRIBUTION GATE (poly)
16: DG2: SECOND DISTRIBUTION GATE (poly)
17: FD1: FIRST CHARGE-STORAGE SECTION (N+)
18: FD2: SECOND CHARGE-STORAGE SECTION (N+)
19: SOX: OXIDE FILM (SOX)
31: SG: SUB-TRANSFER GATE (poly)

11 : SUB : SUBSTRATE (P−)
12 : STI : SEPARATING GROOVE (STI)
13 : PD : PHOTODIODE (N+)
14 : TG : TRANSFER GATE (poly)
15 : DG1 : FIRST DISTRIBUTION GATE (poly)
16 : DG2 : SECOND DISTRIBUTION GATE (poly)
17 : FD1 : FIRST CHARGE-STORAGE SECTION (N+)
18 : FD2 : SECOND CHARGE-STORAGE SECTION (N+)
19 : SOX : OXIDE FILM (SOX)

11: SUB: SUBSTRATE (P−)
12: STI: SEPARATING GROOVE (STI)
13: PD: PHOTODIODE (N+)
14: TG: TRANSFER GATE (poly)
15: DG1: FIRST DISTRIBUTION GATE (poly)
16: DG2: SECOND DISTRIBUTION GATE (poly)
17: FD1: FIRST CHARGE-STORAGE SECTION (N+)
18: FD2: SECOND CHARGE-STORAGE SECTION (N+)
19: SOX: OXIDE FILM (SOX)
31: SG: SUB-TRANSFER GATE (poly)

1. STORAGE

2. TRANSFER

3. SEPARATION

4. RE-TRANSFER

TG : −0.3V   DG : −0.3V

TG : 1V   DG : −0.3V

TG : 1V   DG : 1.5V

TG : −0.3V   DG : 1.5V

PIXEL STRUCTURE OF SOLID-STATE IMAGE SENSOR

BACKGROUND OF THE INVENTION

1. Field of the Invention

The present invention relates to a pixel structure of a solid-state image sensor, more particularly to an improvement of pixels that constitute a solid-state image sensor that can be used as a time-of-flight type distance sensor, which measures time-of-flight by receiving reflection light of light irradiated to an object with the use of time-of-flight measurement method (TOF: Time of flight) and measures a distance to the object based on the time-of-flight, or an image sensor that obtains a three-dimensional image of the object. Particularly the invention relates to a pixel structure of a solid-state image sensor, which can be used as a pixel of a solid-state image sensor employing a charge sorting method that can be used under unknown background light illumination, such as a solid-state image sensor that is equipped with a plurality of charge-storage sections, discriminates photoelectrons generated by incoming light on the timing of incoming light and store them in the plurality of charge-storage sections in a sorting manner.

2. Description of the Related Art

Generally, there is known a so-called time-of-flight measurement method (TOF: Time of flight) in which intensity-modulated illumination light by pulse or high frequency is irradiated on an object, time-of-flight where reflection light from the object reaches an image sensor is measured to calculate distance.

As a solid-state image sensor that can be utilized as an image sensor used in such a time-of-flight measurement method, there is a sensor employing a charge sorting method, which is equipped with a photoelectric conversion section and a plurality of charge-storage sections, for example, discriminates electrons generated in photoelectric conversion section by incoming light on the timing of the incoming light, and stores the discriminated electrons in the plurality of charge-storage sections in a sorting manner.

Meanwhile, according to the solid-state image sensor employing the charge sorting method, a processing of distributing electrons generated in the photoelectric conversion section to a plurality of the charge-storage sections corresponding to the incoming timing of light was conventionally realized by applying a high frequency pulse voltage to gate electrodes installed directly above the oxide film of semiconductor surface.

However, due to multiple reasons such as variation of impurity concentration to be doped in a semiconductor substrate in the vicinity of the gate electrodes, physical shape instability of the gate electrodes, and damage or thickness variation of the oxide film, even if each gate electrode is equipped with the same structure and the same voltage is applied to each gate electrode, there is a fear that passages (channels) of electrons formed on a semiconductor substrate directly under each gate electrode generally do not become completely the same, and it causes a possibility that channels formed directly under the gate electrodes are formed differently in between the gates to cause variation.

When such channels formed directly under each gate electrodes cause variation, electrons that should be distributed in a plurality of charge-storage sections under the same condition are distributed unevenly in a charge-storage section adjacent to a gate electrode having a low threshold value, and a problem that electrons generated in photoelectric conversion section cannot be rightly distributed to the charge-storage sections was pointed out.

Conventionally, to solve the problem regarding the distribution of electrons generated in the photoelectric conversion section, as disclosed in Japanese Patent Laid-open No. 2005-235893 presented as Patent Document 1, for example, a method in which a photo gate structure is employed in the photoelectric conversion section, by which charge residue is removed to generate a potential difference exceeding variation of a threshold value of gate, is proposed.

However, the fact that the photoelectric conversion efficiency of a photo gate is low to light having a long wavelength is known, and raised a new problem that the solid-state image sensor with the photoelectric conversion section employing the photo gate structure had a large obstacle in applying to various applications.

[Patent Document 1]

Japanese Patent Laid-open No. 2005-235893

SUMMARY OF THE INVENTION

The present invention has been created in view of the various problems described above that Prior Art has, and it is an object of the present invention to provide a pixel structure of a solid-state image sensor of charge sorting method used for time-of-flight measurement method or the like, which performs charge storage while distributing electrons, in which uneven distribution of electrons due to a variation in threshold voltages of gates for distributing electrons is eliminated, and a photodiode having sensitivity in a long wavelength can be used as a photoelectric conversion element.

To achieve the objects, the present invention is a pixel structure in which the sorting performance of electrons is improved by constituting gates for distributing electrons in multiple stages and which can be used as pixels of a solid-state image sensor used in time-of-flight measurement method or the like. More particularly, it is a pixel structure in which by changing the structure of gates adjacent to a plurality of charge-storage sections, where influence of variation in threshold values to the distribution of electrons generated in photoelectric conversion section becomes a problem, the variation in threshold values is prevented from affecting the electron distribution capability.

Specifically, the present invention is equipped with a front stage gate that performs readout control of photodiode and a rear stage gate that is positioned on the rear stage of the front stage gate and performs control of distributing electrons to a charge-storage section, the front stage gate gives a potential difference exceeding threshold value variation that the rear stage gate, which performs control of distributing electrons to the charge-storage sections, has in order to prevent the threshold value variation of the rear stage gate distributing electrons from affecting a distribution of electrons to the charge-storage sections.

Then, the present invention is a pixel structure of a solid-state image sensor, which performs charge storage while distributing electrons generated by photoelectric conversion, the structure having: a photodiode that generates electrons by photoelectric conversion; a plurality of charge-storage sections that store electrons generated in the photodiode; and a gate structure that is arranged between the photodiode and the charge-storage section and controls transfer of electrons generated in the photodiode to the plurality of charge-storage sections, in which the gate structure is made up of plural stages of gates, the plural stages of gates have at least has a front stage gate that is arranged adjacent to the photodiode and controls readout of electrons generated in the photodiode and a rear stage gate that is arranged adjacent to the plurality of charge-storage sections on the rear stage of the front stage gate and performs control of distributing electrons read out by the readout control of the front stage gate to the plurality of charge-storage sections.

Further, the present invention is a pixel structure of a solid-state image sensor that performs charge storage while distributing electrons generated by photoelectric conversion, the structure having: a photodiode that generates electrons by photoelectric conversion; a plurality of charge-storage sections that store electrons generated in the photodiode; and a gate structure that is arranged between the photodiode and the charge-storage section and controls transfer of electrons generated in the photodiode to the plurality of charge-storage sections, in which the gate structure is made up of two stages of gates, and the two stages of gates have a gate on the first stage that is arranged adjacent to the photodiode and controls readout of electrons generated in the photodiode and a plurality of gates on the second stage that are adjacent to the rear stage of the gate on the first stage with a predetermined gap, severally arranged corresponding to the plurality of charge-storage sections, and perform control of distributing electrons read out by readout control of the gate on the first stage severally to the plurality of charge-storage sections.

Further, the present invention is a pixel structure of a solid-state image sensor that performs charge storage while distributing electrons generated by photoelectric conversion, the structure having: a photodiode that generates electrons by photoelectric conversion; a plurality of charge-storage sections that store electrons generated in the photodiode; a gate structure that is arranged between the photodiode and the charge-storage section and controls transfer of electrons generated in the photodiode to the plurality of charge-storage sections, in which the gate structure is made up of three stages of gates, and the three stages of gates have a gate on the first stage that is arranged adjacent to the photodiode and controls readout of electrons generated in the photodiode, a gate on the second stage that is adjacent to the rear stage of the gate on the first stage with a predetermined gap and controls the movement of electrons read out by readout control of the gate on the first stage to the plurality of charge-storage sections, and a plurality of gates on the third stage, which are adjacent to the rear stage of the gate on the second stage with a predetermined gap, severally arranged corresponding to the plurality of charge-storage sections, and perform control of distributing electrons moved by the movement control of the gate on the second stage severally to the plurality of charge-storage sections.

Since the present invention is constituted as described above, an excellent effect is exerted that in a pixel structure of a solid-state image sensor of charge sorting method used in a time-of-flight measurement method or the like, which performs charge storage while distributing electrons, a pixel structure of a solid-state image sensor, in which uneven distribution of electrons by a variation in threshold voltage of the gate for distributing electrons is eliminated and the photodiode having sensitivity in long wavelength can be used as a photoelectric conversion element, can be provided.

The present invention can be used for a solid-state image sensor as a distance sensor that is mounted on an automobile or the like to measure a distance to an obstacle.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1(a) is a plan constitution explanatory view schematically showing the pixel structure of a solid-state image sensor according to the first embodiment of the present invention, in which FIG. 1(b) is a cross-sectional constitution explanatory view schematically showing a cross-section taken along A-A line of FIG. 1(a);

FIG. 3(a)(b)(c)(d) are explanatory views of a movement of electrons generated by a photodiode (PD), in which FIG. 3(a) shows the state of electron in State 1 shown in FIG. 2(b)

FIG. 7(a) is a plan constitution explanatory view schematically showing the pixel structure of a solid-state image sensor according to the second embodiment of the present invention, in which

DETAILED DESCRIPTION OF THE PREFERRED EMBODIMENTS

Hereinafter, description will be made for an embodiment example of the pixel structure of a solid-state image sensor according to the present invention in detail referring to the attached drawings.

1. First Embodiment

Two-Stage Gate Structure (1) Constitution

FIG. 1(a) shows the plan constitution explanatory view schematically showing the pixel structure of a solid-state image sensor according to the first embodiment of the present invention, and FIG. 1(b) shows the cross-sectional constitution explanatory view schematically showing the cross-section taken along A-A line of FIG. 1(a).

Figure 1:
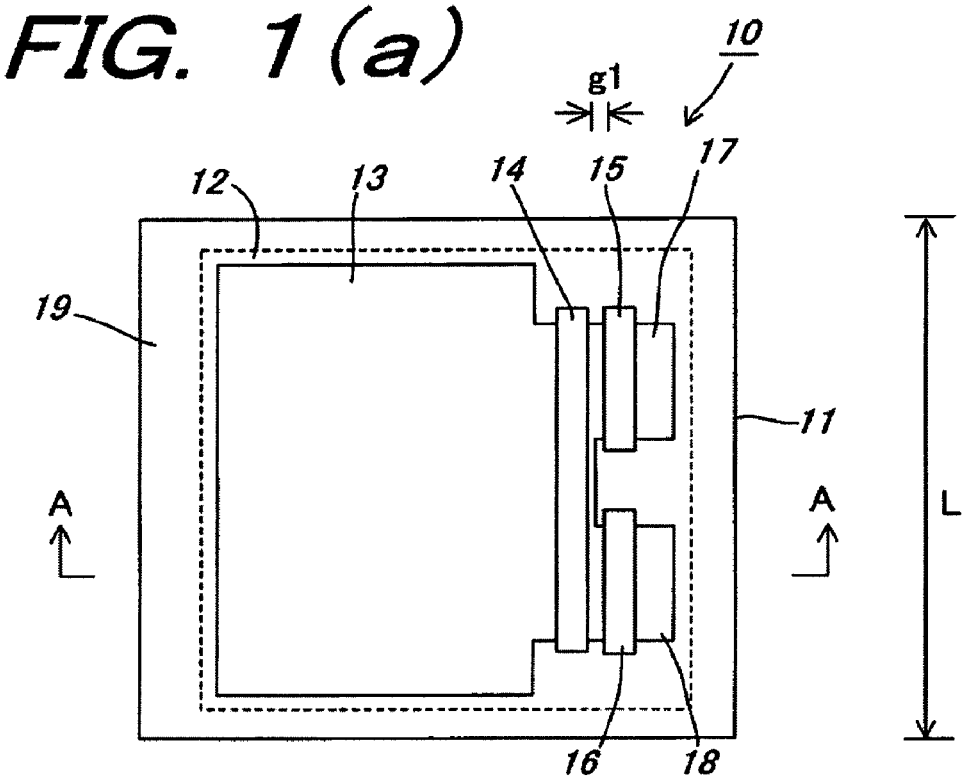
Figure 1:
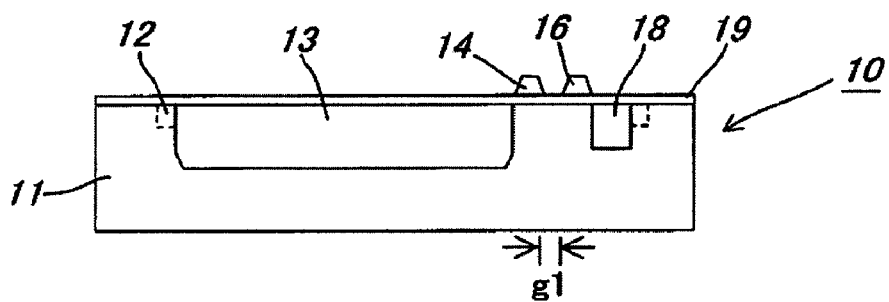

Comparing a pixel structure 10 by the present invention shown in FIG. 1 with a conventional pixel structure, the pixel structure 10 by the present invention is different from the conventional pixel structure on the point where a transfer gate (TG) 14 being a gate on the first stage (front stage gate) that receives light and performs readout control of a photodiode that generates electrons by photoelectric conversion (photodiode: PD) 13, distribution gates (DG) being the gates of the second stage (rear stage gate) (in the pixel structure 10, two distribution gates (DG) made up of a first distribution gate (DG1) 15 and a second distribution gate (DG2) 16 are provided as the distribution gate (DG)), which are positioned on the rear stage of the transfer gate (TG) 14 and performs control of distributing electrons to charge-storage sections (FD) (in the pixel structure 10, two charge-storage sections (FD) made up of a first charge-storage section (FD1) 17 and a second charge-storage section (FD2) 18 are provided as the charge-storage sections (FD)), are adjacently disposed.

In other words, the photodiode 13 occupying a wide area in the pixel structure 10 is arranged adjacent to the transfer gate 14 being the gate on the first stage, a plurality (two in this embodiment) of gates of the second stage being the first distribution gates 15 and the second distribution gate 16, which are adjacent to the transfer gate 14, are arranged adjacent to each other, and a plurality (two in this embodiment because distribution gates are two) of the first charge-storage section 17 and the second charge-storage section 18, which are respectively adjacent to the first distribution gate 15 and the second distribution gate 16 and correspond to each distribution gate, are arranged.

Herein, the smaller a gap g1 between the transfer gate 14 being the gate on the first stage and a plurality of gates of the second stage being the first distribution gate 15 and the second distribution gate 16, which are adjacent to the transfer gate 14, the better, and in the case where these gates are gates formed on a polysilicon layer of the same layer, it is preferable to set the gap g1 to about 0.2 µm that is the minimum value limited by manufacturing rules, for example.

Figure 11:
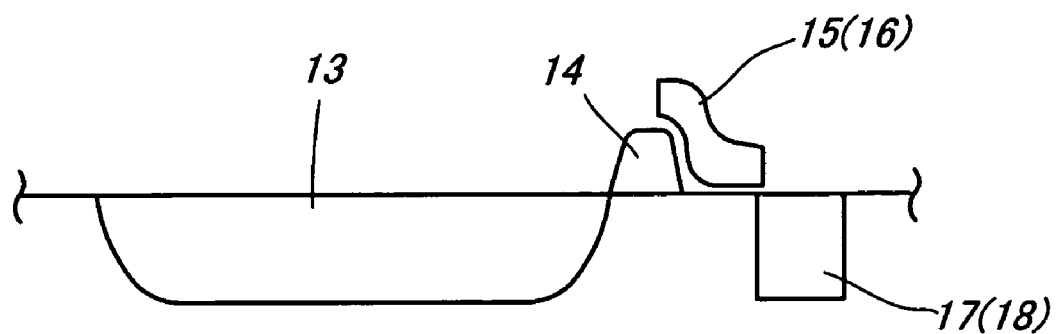
FIG. 11 is a cross-sectional constitution explanatory view schematically showing the cross-section in the state where the transfer gate and the distribution gate are arranged in an overlapped manner.

On the other hand, in the case where these gates are gates formed on different polysilicon layers, the minimum gap created by an interface between different polysilicon layers automatically satisfies conditions of the gap g1. As shown in FIG. 11, the transfer gate 14, the first distribution gate 15 and the second distribution gate 16 can be constituted so as to have a slightly overlapped region.

Further, an area around each element of the photodiode 13, the transfer gate 14, the first distribution gate 15, the second distribution gate 16, the first charge-storage section 17 and the second charge-storage section 18 is separated from a substrate (SUB) 11 by a separating groove (STI) 12.

Next, referring to FIG. 1(b), description will be made for the case where a P-type semiconductor substrate is used as the substrate 11 and the elements of the pixel structure are constituted on the substrate 11 made of the P-type semiconductor substrate.

In other words, the photodiode 13 is formed by N-type dope of middle concentration in this case, the diode is formed such that sensitivity in a long wavelength side is expanded by setting an ion implantation depth relatively thick.

Further, the first charge-storage section 17 and the second charge-storage section 18 are drains formed by N-type dope of high concentration.

Herein, generally, such an N-type dope can be formed by a so-called self alignment method in which ions are implanted after forming oxide film (SOX) 19, the transfer gate 14 of polysilicon, the first distribution gate 15 and the second distribution gate 16 on the substrate 11.

At this point, it is necessary to mask a gap between the transfer gate 14, the first distribution gate 15 and the second distribution gate 16 to prevent the gap from being N-type doped.

As a result, the gap between the transfer gate 14, the first distribution gate 15 and the second distribution gate 16 is formed, unchanged from the state of the P-type semiconductor substrate, that is, so as to be a native channel.

Herein, the reason of forming the gap between the transfer gate 14, the first distribution gate 15 and the second distribution gate 16 in the native channel is as follows.

In other words, in the present invention, it is necessary that a potential of a gap between each gate be controlled by a voltage applied to adjacent gates to form a continuous potential channel, and the most simple method is to form the gap in the native channel. However, if the potential gap between each gate is controlled by a voltage applied to adjacent gates to form the continuous potential channel, it goes without saying that appropriate impurity may be doped in the gap between each gate.

Note that each element of the photodiode 13, the transfer gate 14, the first distribution gate 15, the second distribution gate 16, the first charge-storage section 17 and the second charge-storage section 18 is generally formed on the P-type semiconductor substrate, as described referring to FIG. 1(a)(b), but not limited to the P-type semiconductor substrate, it goes without saying that the element may be formed on a P-well.

Further, it goes without saying that an N-type semiconductor substrate may be used as the substrate 11, all of P-type and N-type of each element described above may be inverted, and each element may be formed on the N-type semiconductor substrate, and furthermore, each element may be similarly formed on an N-well.

Although an appropriate size can be arbitrarily selected for a size of an element depending on an object and an application, a four-square having the length L of one side of 10 µm to 50 µm, that is, about 10 µm square to about 50 µm square is practical as the entire size of pixel 10.

Further, the gate length of each gate should be optimized based on substrate impurity concentration, oxide film thickness, and compatibility of channel formation by applied voltage, but about 0.5 μm to 10 μm is appropriate, for example.

(2) Action (2-1) Explanation of Potential

Figure 2A:
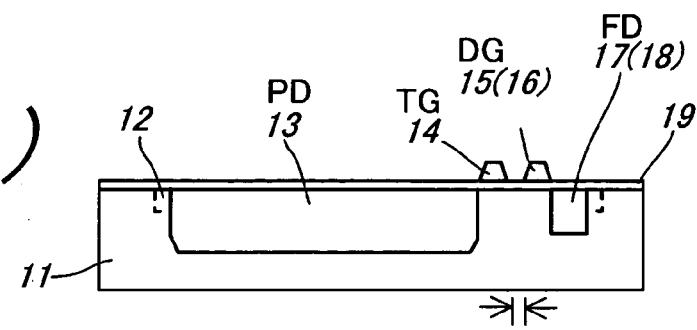
FIG. 2(a) is the same cross-sectional constitution explanatory view as FIG. 1(b), in order to make FIG. 2(b)(c)(d)(e) easily understandable, and FIG. 2(b)(c)(d)(e) are explanatory views schematically showing a potential in semiconductor when a voltage is applied to a transfer gate, a first distribution gate, a second distribution gate, while allowing it to correspond to each element in the cross-sectional explanatory view shown in FIG. 2(a)
Figure 2B:
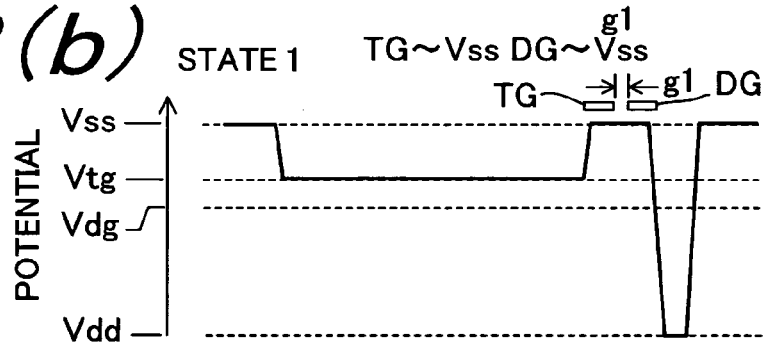

FIG. 2(a) shows the same drawing as FIG. 1(b) for easy understanding of FIG. 2(b)(c)(d)(e), and FIG. 2(b)(c)(d)(e) show the explanatory views schematically showing a potential in semiconductor when a voltage is applied to the transfer gate 14, the first distribution gate 15 and the second distribution gate 16 while corresponding it to each element in the cross-sectional explanatory view shown in FIG. 2(a).

Note that the square figures illustrated directly above the potential in FIG. 2(b)(c)(d)(e) severally show the transfer gate (TG) 14 and the distribution gate (DG) (as described later, it means either one of the first distribution gate 15 and the second distribution gate 16), in which the state where the square is in outline indicates that a potential near a substrate potential Vss (note that "potential near substrate potential Vss" will be described later) is being given, whereas the state where the square is painted out in black indicates that a positive potential is applied.

First, when the first charge-storage section 17 and the second charge-storage section 18 are reset to a power source voltage Vdd and the photodiode 3 is reset to a voltage Vtg as an initial condition and this state is used as an initial state, the four states shown in FIG. 2(b)(c)(d)(e) are obtained due to voltage application to each gate.

Herein, the power source voltage Vdd, the voltage Vtg and the optimum value of a voltage Vdg used in this explanation should be determined by the characteristics of semiconductor, but when the substrate potential Vss is used as a standard, for example, it is preferable to set the power source voltage Vdd to approximately 3.3V, the voltage Vtg to approximately 1.0V, and the voltage Vdg to approximately 1.5V.

Note that the "potential near the substrate potential Vss" is a slightly negative voltage than the substrate potential Vss, which is a threshold value potential of the transfer gate 14 dependent on impurity concentration or the like of a channel, and means a voltage of about −0.3V that forms a potential of the substrate potential Vss directly under the transfer gate 14, for example. Hereinafter, the meaning of the "potential near the substrate potential Vss" should mean the same content.

Further, since a plurality of the distribution gates (DG) and the charge-storage sections (FD) (specifically, the first distribution gate 15 and the second distribution gate 16 are provided, and the first charge-storage section 17 and the second charge-storage section 18 are provided, and two each of the distribution gates (DG) and the charge-storage sections (FD) are provided) exist in the pixel structure 10, quantity in the case of state increases corresponding to the number of the distribution gates (DG) and the charge-storage sections (FD). In the following explanation, for easy understanding of the present invention, it is assumed that only a focused distribution gate (DG), which is only the first distribution gate 15, for example, be changed and another distribution gate (the second distribution gate 16, for example) be fixed to the potential near the substrate potential Vss.

In other words, the distribution gate (DG) and the charge-storage section (FD) in the explanation of State 1 to State 4 shown in (2-1-1) to (2-1-4) below show a focused distribution gate (the first distribution gate 15, for example) out of the first distribution gate 15 and the second distribution gate 16, and the first charge-storage section 17 or the second charge-storage section 18 (for example, it is the first charge-storage section 17 when the first distribution gate 15 is focused) adjacent to the focused distribution gate (the first distribution gate 15, for example).

(2-1-1) Explanation of State 1 (Refer to FIG. 2(b))

First, State 1 shown in FIG. 2(b) shows the potential near the substrate potential Vss was given from the initial state to both the transfer gate (TG) 14 and the distribution gate (DG). The State 1 is a basic state in State 1 to state 4.

Although there is a slight error determined by impurity concentration of a front-end semiconductor and oxide film thickness, an area directly under the transfer gate (TG) 14 and the distribution gate (DG) becomes approximately the potential of the substrate potential Vss, the photodiode (PD) 13 and the charge-storage section (FD) enter a potentially isolated state.

In FIG. 2(b)(c)(d)(e), for convenience sake, the drawings are depicted based on the assumption that the potential of the photodiode (PD) 13 is equal to the voltage Vtg reset under the initial condition and the potential of the charge-storage section (FD) is equal to the power source voltage Vdd reset under the initial condition.

Figure 2C:
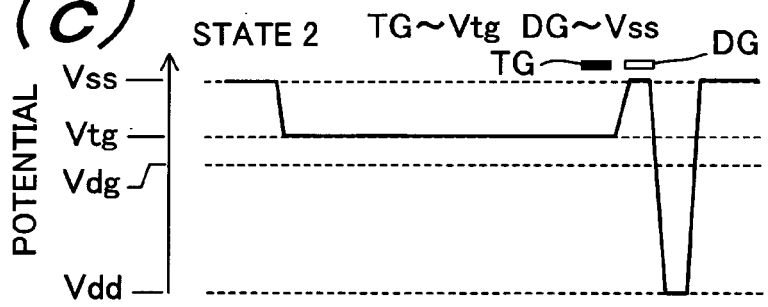

(2-1-2) Explanation State 2 (Refer to FIG. 2(c))

Next, State 2 shows a potential when a positive potential being the voltage Vtg is applied to the transfer gate (TG) 14, a channel is formed directly under the transfer gate (TG) 14, and although the potential has an error as described above, it becomes a potential of approximately the voltage Vtg to be continuous with the potential of the photodiode (PD) 13.

Regarding the gap g1 between the transfer gate (TG) 14 and the distribution gate (DG), influence of the voltage Vtg applied to the transfer gate (TG) 14 interferes influence of the substrate potential Vss applied to the distribution gate (DG), so that the inclined potential as shown in FIG. 2(c) is formed.

Herein, this inclination of potential is determined by an impurity concentration of front-end semiconductor, an oxide film thickness, a difference of voltages severally applied to the transfer gate (TG) 14 and the distribution gate (DG) (applied voltage difference), and a distance of the gap g1 between the transfer gate (TG) 14 and the distribution gate (DG).

Since inclination might not be smoothly continuous if the distance of the gap g1 between the transfer gate (TG) 14 and the distribution gate (DG) is large, it is preferable to make the distance of the gap g1 small, and is desirable to set the distance to about 0.1 to 0.5 μm, specifically it can be set to about 0.2 μm, for example.

Figure 2D:
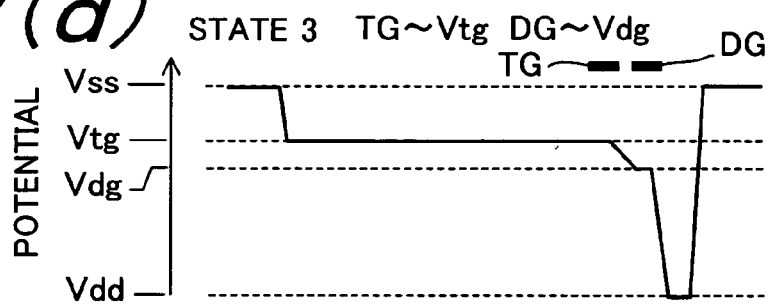

(2-1-3) Explanation State 3 (Refer to FIG. 2(d))

Next, state 3 shows a potential when a positive potential being the voltage Vdg is applied to the distribution gate (DG) in addition to State 2. In the state 3, a channel is formed directly under the distribution gate (DG), and although the potential has an error as described above, it becomes a potential of approximately the voltage Vdg.

Therefore, a continuous channel having inclination in the narrow the gap g1 is formed for the transfer gate (TG) 14 adjacent to the distribution gate (DG).

Further, for the charge-storage section (FD) adjacent to the distribution gate (DG), a steeply inclined potential dependent on a voltage difference between the voltage Vdg and the power source voltage Vdd is formed.

Herein, assuming that the voltage Vdg is a voltage sufficiently positive comparing to the voltage Vtg and sufficiently negative comparing to the power source voltage Vdd, a channel having substantially continuous potential inclination from the photodiode (PD) 13 to the charge-storage section (FD) can be formed as shown in FIG. 2(d).

Figure 2E:
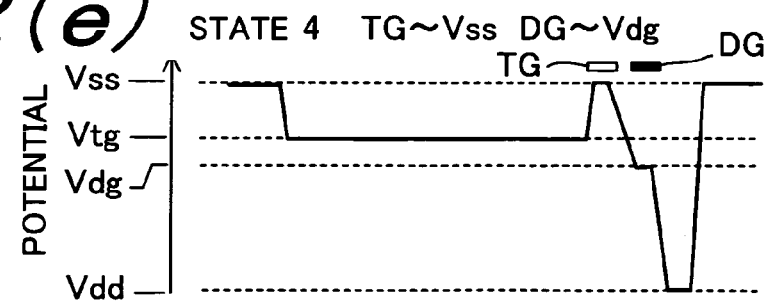

(2-1-4) Explanation State 4 (Refer to FIG. 2(e))

Next, State 4 shows a potential in which an potential near the substrate potential Vss is given to the transfer gate (TG) 14 to return the voltage of a transfer gate (TG) 1 to a voltage near the substrate potential Vss, and the voltage Vdg is applied to the distribution gate (DG). This allows the photodiode (PD) 13 be potentially separated from the charge-storage section (FD).

(2-1-5) Summary of the Explanation from State 1 to State 4

By repeating State 1 to State 4 in the order of State 1→State 2→State 3→State 4→State 1→State 2→State 3→State 4→(the same order applies after this), electrons generated in the photodiode (PD) 13 can be stored in the charge-storage section (FD) as described later.

(2-2) Explanation of Electron Movement

Figure 3A:
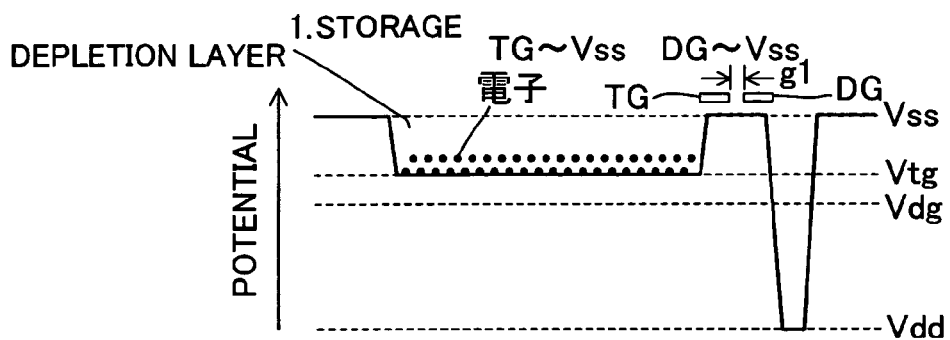

Next, referring to FIG. 3(a)(b)(c)(d), description will be made for the movement of electrons generated in the photodiode (PD) 13. Note that FIG. 3(a) shows the state of electrons in State 1 shown in FIG. 2(b), FIG. 3(b) shows the state of electrons in State 2 shown in FIG. 2(c), FIG. 3(c) shows the state of electrons in State 3 shown in FIG. 2(d), and FIG. 3(d) shows the state of electrons in State 4 shown in FIG. 2(e).

When the photodiode 13 is exposed in the pixel structure 10, electrons generated by photoelectric conversion of the photodiode 13 are stored in a depletion layer of the photodiode 13 itself in the basic state of State 1 shown in FIG. 2(b). Then, as a certain period of time passes, electrons (electrons are shown in black dots in FIG. 3(a)(b)(c)(d)) are filled in the depletion layer of the photodiode 3 as shown in FIG. 3(a), and a potential in a PD section (the photodiode 13 region) increases (storage of electrons).

Then, transfer of electrons stored in the depletion layer of the photodiode 13 is performed by applying a voltage to the transfer gate (TG) 14 and the distribution gate (DG) in the order of State 2, State 3 and State 4 shown in FIG. 2(c)(d)(e).

Figure 3B:
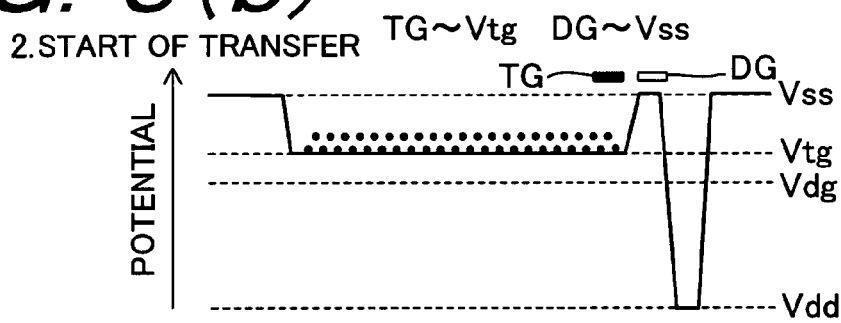
FIG. 3(b) shows the state of electron in State 2 shown in FIG. 2(c)
Figure 3C:
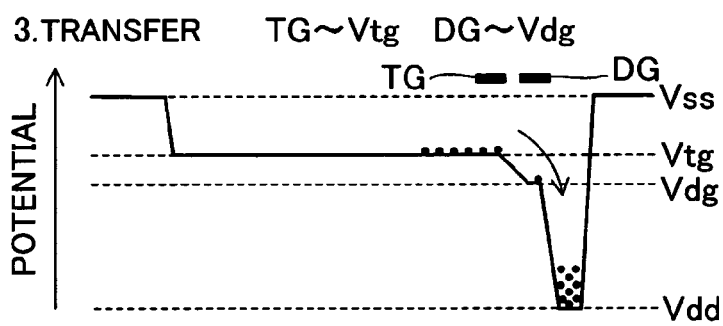
FIG. 3(c) shows the state of electron in State 3 shown in FIG. 2(d)
Figure 3D:
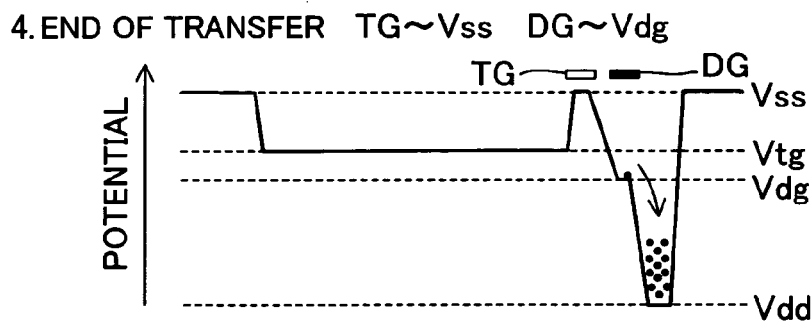
FIG. 3(d) shows the state of electrons in State 4 shown in FIG. 2(e)

In other words, in State 2 shown in FIG. 2(c), electrons spread to the channel formed directly under the transfer gate (TG) 14 as shown in FIG. 3(b), but electrons cannot move to the charge-storage section (FD) at this point because potential directly under the distribution gate (DG) works as a wall (start of electron transfer).

Moreover, when a channel is formed directly under the distribution gate (DG) by applying the positive voltage Vdg to the distribution gate (DG) into State 3 shown in FIG. 2(d), electrons move to the charge-storage section (FD) along the inclination of potential as shown in FIG. 3(c) (transfer of electrons).

Herein, when the inclination of potential is sufficiently large, electrons cannot move against the inclination in room temperature.

More particularly, when the potential of State 3 shown in FIG. 2(d) is formed, electrons generated in the photodiode (PD) 13 pass the channel directly under the transfer gate (TG) 14 and the channel directly under the distribution gate (DG), and move to the charge-storage section (FD). At this point, the potential of the charge-storage section (FD) increases due to injected electrons, but electrons move in one direction from the photodiode (PD) 13 to the charge-storage section (FD) if the potential of the charge-storage section (FD) is lower than the voltage Vdg.

Therefore, all photoelectrons generated by exposure in a time of transition of State 1, State 2 and State 3 in the pixel structure 10 move to the charge-storage section (FD).

Further, even if electrons are residual directly under the transfer gate (TG) 14 in State 3, the residual electrons drop into the distribution gate (DG) side having a lower potential as shown in FIG. 3(d) when they move from State 3 shown in FIG. 2(d) to State 4 shown in FIG. 2(e) (end of electron transfer).

Then, when the voltage applied from State 4 to the distribution gate (DG) is returned to the potential near the substrate potential Vss, state moves to State 1, and the channel formed directly under the distribution gate (DG) completely disappears.

Therefore, in the movement from State 4 shown in FIG. 3(d) to State 1 shown in FIG. 3(a), even if residual electrons are directly under the distribution gate (DG), they drop into the charge-storage section (FD) side having a lower potential.

In other words, by controlling the applied voltage to the transfer gate (TG) 14 and the distribution gate (DG) in the order of State 1→State 2→State 3→State 4→State 1→State 2→State 3→State 4→(the same order applies after this), the movement of electrons from the photodiode (PD) 13 to the charge-storage section (FD) can be controlled in one direction, all electrons generated in the photodiode (PD) 13 are moved to the charge-storage section (FD), and electrons can be completely transferred to the charge-storage section (FD).

Meanwhile, when a voltage difference between the substrate potential Vss, the voltage Vtg, the voltage Vdg and the power source voltage Vdd is sufficiently larger than variation in threshold voltages of the transfer gate (TG) 14 and the distribution gate (DG), the variation in threshold values does not significantly affect the transfer of electrons caused by the above-described action.

Generally, threshold value variation of gate formed in the pixel structure is considered to be about the same as gate threshold value variation of a regular FET transistor, and its value is approximately 10 mV or less.

Therefore, although a voltage difference between the voltage Vtg and the voltage Vdg should only theoretically be about 10 mV, but because electron movement becomes faster as the inclination of potential becomes steeper, it is desirable to set the difference at least to 100 mV or more, and more preferably to about 0.5V, for example.

(2-3) Explanation of Distribution of Electrons

Next, referring to the explanatory views shown in FIG. 4(a)(b) where charge sorting actions are schematically shown, description will be made for a method in which electrons moving from the photodiode (PD) 13 to the charge-storage section (FD) are specifically distributed in a sorting manner and stored in the first charge-storage section (FD1) 17 and the second charge-storage section (FD2) 18 in the pixel structure 10 as described above referring to FIG. 3(a)(b)(c)(d), that is, a method in which the movement of electrons that occurs by controlling the voltage applied to the transfer gate (TG) 14 and the distribution gate (DG) to caused transition of the four states from State 1 to State 4 to is specifically applied to the pixel structure 10 having two distribution gates (the first distribution gate (DG1) 15 and the second distribution gate (DG2) 16) and two charge-storage sections (the first charge-storage section (FD1) 17 and the second charge-storage section (FD2) 18).

The method is that, in the transfer state shown in State 3 of FIG. 3(c), that is, when the positive voltage is applied to both of the transfer gate (TG) 14 and the distribution gate (DG), the first distribution gates (DG1) 15 and the second distribution gate (DG2) 16 actually exist in the pixel structure 10, so that either one of the first distribution gate (DG1) 15 or the second distribution gate (DG2) 16 is set to the substrate potential Vss.

Figure 4A:
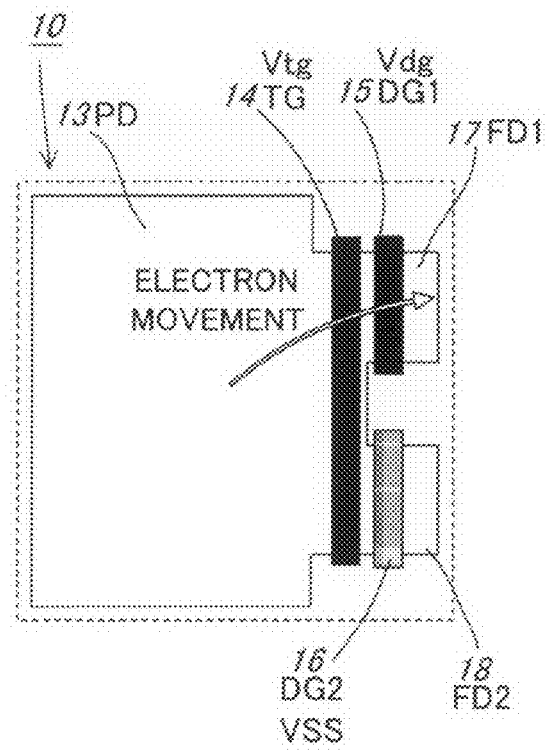
FIG. 4(a)(b) are explanatory views schematically showing charge sorting actions.
Figure 4B:
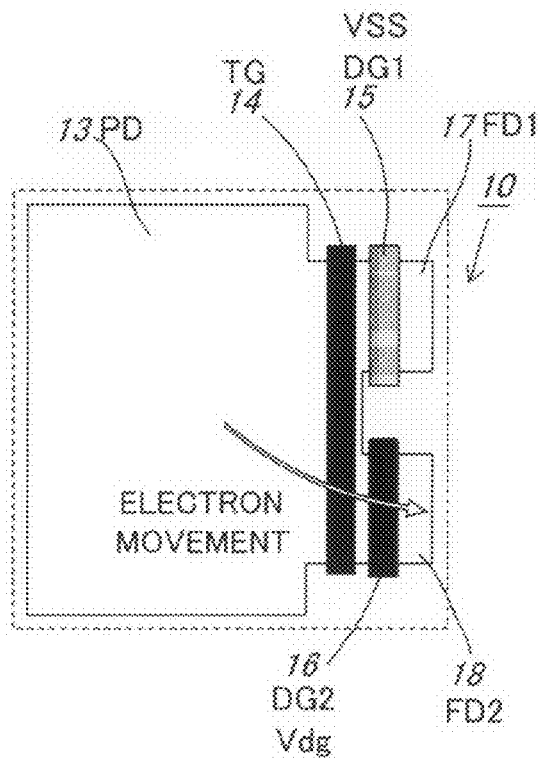

Herein, the explanatory view shown in FIG. 4(a) shows the state where the voltage Vdg is applied to the first distribution gate (DG1) 15 and the substrate potential Vss is given to the second distribution gate (DG2) 16, whereas the explanatory view shown in FIG. 4(b) shows the state that the voltage Vdg is applied to the second distribution gate (DG2) 16 and the substrate potential Vss is given to the first distribution gate (DG1) 15.

Since electrons can flow in a channel directly under a distribution gate (DG) to which the positive voltage Vdg was applied out of two distribution gates (DG), that is, the first distribution gate (DG1) 15 and the second distribution gate (DG2) 16, electrons are distributed and stored in a charge-storage section (FD) adjacent to the distribution gate (DG) to which the positive voltage Vdg was applied.

In other words, since the voltage Vdg is applied to the first distribution gate (DG1) 15 in FIG. 4(a), electrons move to the first charge-storage section (FD1) 17, whereas electrons move to the second charge-storage section (FD2) 18 because the voltage Vdg is applied to the second distribution gate (DG2) 16 in FIG. 4(b).

More particularly, electrons stored in the photodiode (PD) 13 in the storage state in State 1 shown in FIG. 3(a), when a voltage is applied to the transfer gate (TG) 14 in the transfer starting state of State 2 shown in FIG. 3(b), takes either the state of FIG. 4(a) or the state of FIG. 4(b) immediately after the voltage application. In other words, in the transfer state of State 3 shown in FIG. 3(c), setting either the first distribution gate (DG1) 15 or the second distribution gate (DG2) 16 to the substrate potential Vss as described above allows electrons to take either the state of FIG. 4(a) or the state of FIG. 4(b).

Herein, in the case of the state FIG. 4(a), because the state of potential regarding the first distribution gate (DG1) 15 and the first charge-storage section (FD1) 17 correspond to FIG. 3(c), the movement of electrons to the first charge-storage section (FD1) 17 occurs. However, because the state of potential regarding the second distribution gate (DG2) 16 and the second charge-storage section (FD2) 18 corresponds to FIG. 3(b), the movement of electrons to the second charge-storage section (FD2) 18 does not occur.

On the contrary, in the case of the state FIG. 4(b), because the state of potential regarding the second distribution gate (DG2) 16 and the second charge-storage section (FD2) 18 correspond to FIG. 3(c), the movement of electrons to the second charge-storage section (FD2) 18 occurs. However, because the state of potential regarding the first distribution gate (DG1) 15 and the first charge-storage section (FD1) 17 corresponds to FIG. 3(b), the movement of electrons to the first charge-storage section (FD1) 17 does not occur.

In other words, by alternately performing a cycle that transition from State 1 shown in FIG. 2(b) to State 2 shown in FIG. 2(c) is done, then only a distribution gate (DG) out of the first distribution gate (DG1) 15 and the second distribution gate (DG2) 16 is allowed to have transition to State 3 shown in FIG. 2(d) and State 4 shown in FIG. 2(e), the other distribution gate (DG) is maintained as it is at State 2, and both of the first distribution gate (DG1) 15 and the second distribution gate (DG2) 16 are returned to State 1 for each distribution gate (DG), photoelectrons generated at certain timing can be moved to a desired charge-storage section (FD) and stored in a distributed manner.

Figure 5:
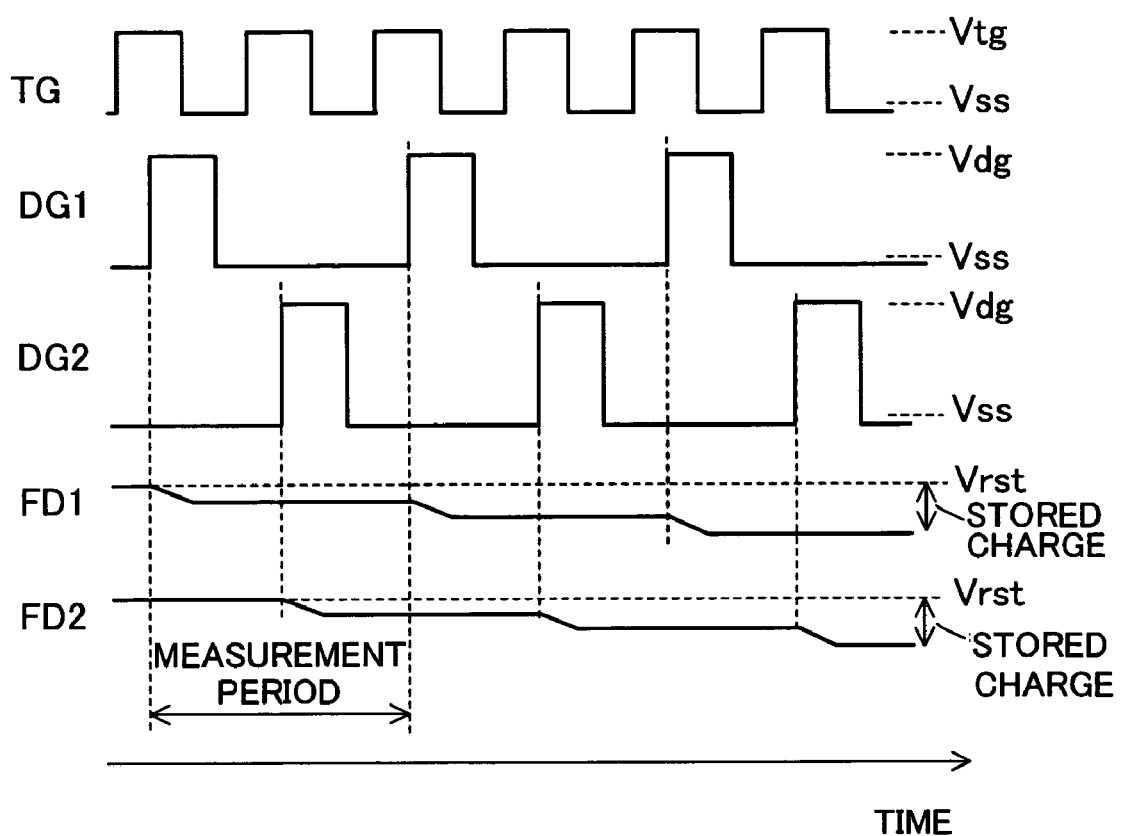
FIG. 5 is a schematic explanatory view regarding drive voltage waveform and charge storage of each gate.

Note that FIG. 5 shows the schematic explanatory view regarding the drive voltage waveform of each gate and the charge storage, and by inputting voltage pulse to the transfer gate (TG) 14, the first distribution gate (DG1) 15 and the second distribution gate (DG2) 16 like the drive waveform shown in FIG. 5, the state transition cycle can be repeated.

Electrons injected to the charge-storage section (FD) by one transfer of electrons reduce the voltage of the charge-storage section (FD), and by repeating it, the voltage of the charge-storage section (FD) reduces in an integral manner (refer to the chart of FD1 and FD2 in FIG. 5).

(3) Modified Example of the First Embodiment (Structure Equipped with Four Distribution Gates (DG) and Four Charge-Storage Sections (FD))

Figure 6:
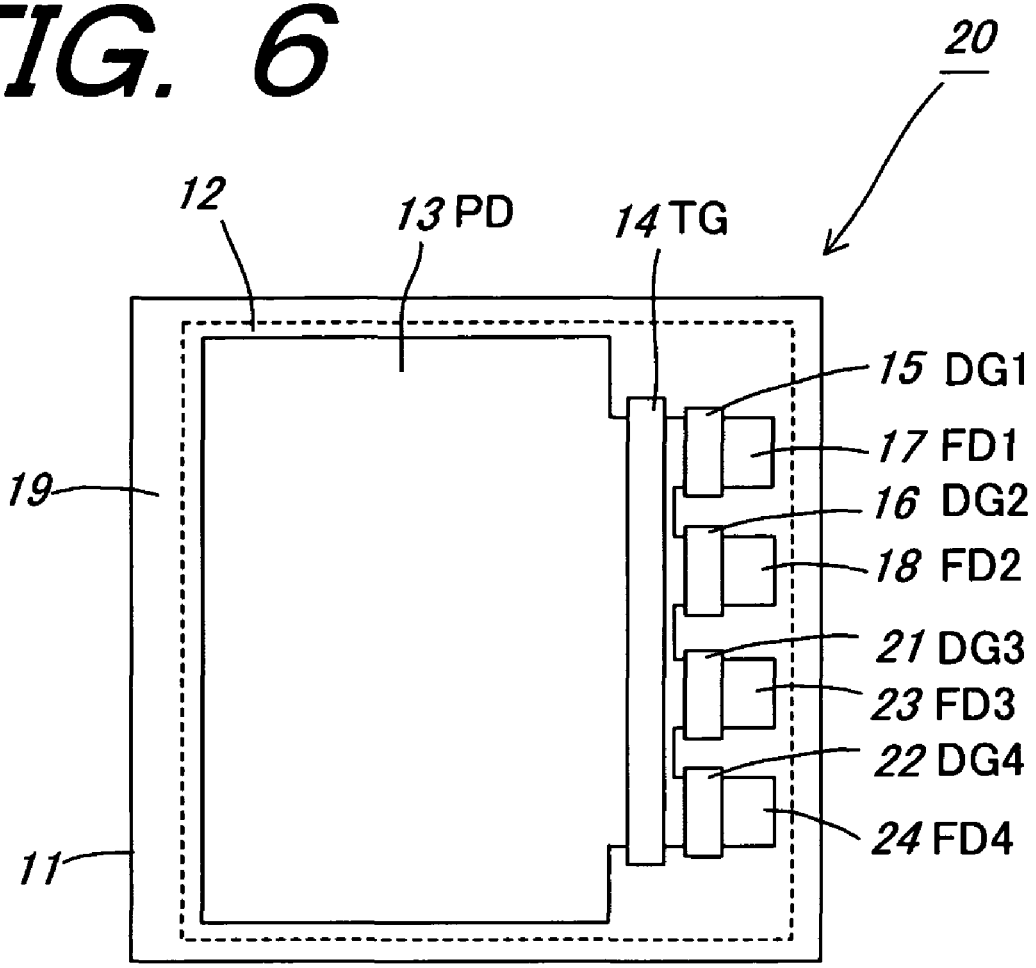
FIG. 6 is a plan constitution explanatory view schematically showing a modified example of the pixel structure of a solid-state image sensor according to the first embodiment of the present invention.

FIG. 6 shows a pixel structure 20 equipped with four distribution gates (DG) and four charge-storage sections (FD) as a modified example of the pixel structure 10.

In other words, although the number of the distribution gate (DG) and the charge-storage section (FD) is arbitrary as already described above, the pixel structure 20 as shown in FIG. 6, in which the four distribution gates (DG) and the four charge-storage sections (FD) are arranged, for example, can be built.

Now, in the pixel structure 20 shown in FIG. 6, numerical characters same as the numerical characters used in FIG. 1(a)(b) are shown for constitutions same as or equivalent to the constitutions shown in FIG. 1(a)(b), and detailed description of the constitutions and functions should be omitted appropriately.

The pixel structure 20 shown in FIG. 6 is different from the pixel structure 10 shown in FIG. 1(a)(b) on the point that it is equipped with a third distribution gate (DG3) 21 and a fourth distribution gate (DG4) 22 in addition to the first distribution gate (DG1) 15 and the second distribution gate (DG2) 16 as the distribution gate (DG), and equipped with a third charge-storage section (FD3) 23 adjacent to the third distribution gate (DG3) 21 and a fourth charge-storage section (FD4) 24 adjacent to the fourth distribution gate (DG4) 22 in addition to the first charge-storage section (FD1) 17 and the second charge-storage section (FD2) 18 as the charge-storage section (FD).

As in the pixel structure 20, the four distribution gates (DG) and the four charge-storage sections (FD) are arranged, and by alternately performing a cycle that transition from State 1 shown in FIG. 2(b) to State 2 shown in FIG. 2(c) is done, then only a distribution gate (DG) is allowed to have transition to State 3 shown in FIG. 2(d) and State 4 shown in FIG. 2(e), the other three distribution gates (DG) are maintained as it is at State 2, all of the four distribution gates (DG) are returned to State 1 for each distribution gate (DG), photoelectrons generated at certain timing can be moved to a desired charge-storage section (FD) and stored in a distributed manner, and electrons can be distributed and stored with respect to four phases or four types of delay.

2. Second Embodiment

Three-Stage Gate Structure (1) Constitution

Figure 7A:
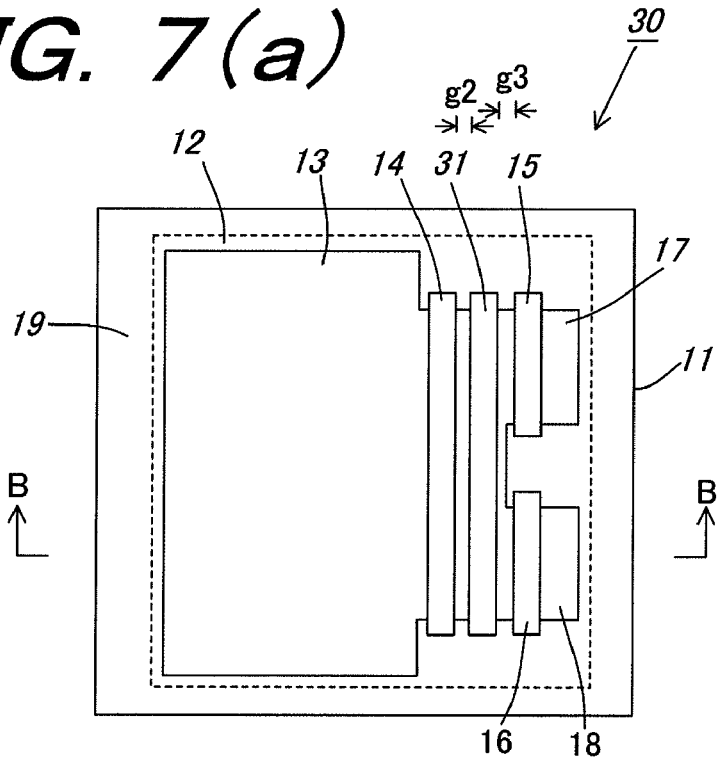
Figure 7B:
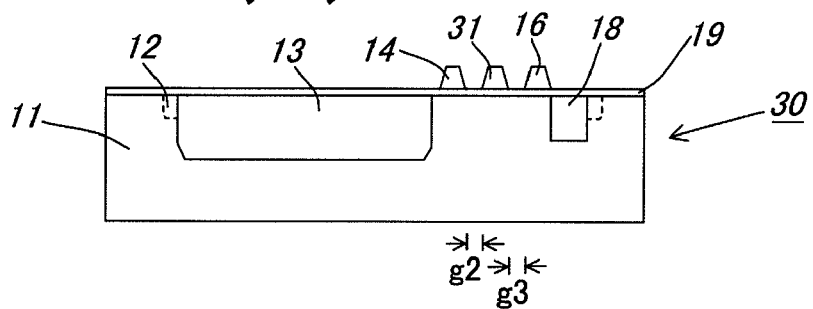
FIG. 7(b) is a cross-sectional constitution explanatory view schematically showing a cross-section taken along B-B line of FIG. 7(a)

FIG. 7(a) shows the plan constitution explanatory view schematically showing the pixel structure of the solid-state image sensor according to the second embodiment of the present invention, and FIG. 7(b) shows the cross-sectional constitution explanatory view schematically showing a cross-section taken along B-B line of FIG. 7(a).

Now, in the pixel structure shown in FIG. 7(a)(b), numerical characters same as the numerical characters used in FIG. 1(a)(b) are shown for constitutions same as or equivalent to the constitutions shown in FIG. 1(a)(b), and detailed description of the constitutions and functions should be omitted appropriately.

Herein, when a pixel structure 30 shown in FIG. 7(a)(b) is compared with the pixel structure 10, the pixel structure 30 is different from the pixel structure 10 on the point that a sub gate (SG) 31 is arranged as a middle gate between the transfer gate (TG) 14 being a front stage gate, the first distribution gate (DG1) 15 and the second distribution gate (DG2) 16 being rear stage gates.

In other words, regarding the constitution of the pixel structure 30, constitutions other than the sub gate (SG) 31 are identical to the pixel structure 10, so that explanation of other constitutions except for the sub gate (SG) 31 is appropriately omitted.

Herein, the smaller a gap g2 between the transfer gate 14 and the sub gate 31 adjacent thereto and a gap g3 between the sub gate 31 and a plurality of distribution gates adjacent thereto (the first distribution gate (DG1) 15 and the second distribution gate (DG2)), the better. In the case where these gates are gates formed on the polysilicon layer of the same layer, for example, it is preferable to set the gap g2 and the gap g3 to the minimum value limited by manufacturing rules, that is, about 0.2 μm, for example.

On the other hand, in the case where these gates are gates formed on different polysilicon layers, the minimum gap by an interface between different polysilicon layers automatically satisfies the conditions of the gap g2 and the gap g3. For this reason, it is possible to constitute the transfer gate 14 and the sub gate 31 so as to have a slightly overlapped region, and constitute the sub gate 31, the first distribution gate 15 and the second distribution gate 16 so as to have a slightly overlapped region.

(2) Action (Movement of Electrons and Distribution in Three-Stage Gate Structure)

Next, referring to FIG. 8(a)(b)(c)(d), description will be made for a potential in semiconductor and the movement of electrons generated in the photodiode (PD) 13.

Figure 8A:
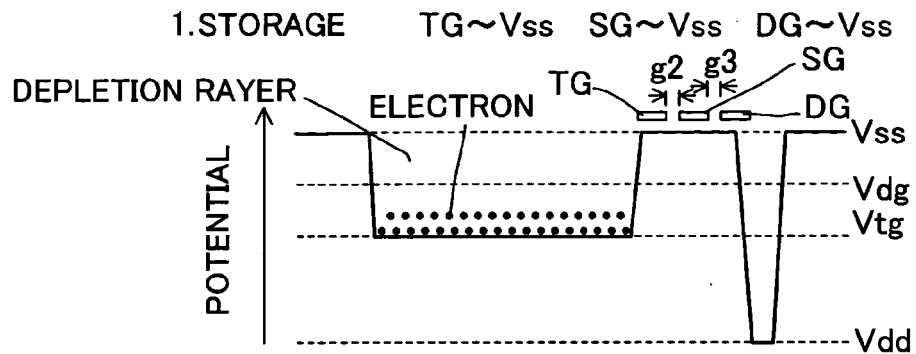
FIG. 8(a)(b)(c)(d) are explanatory views of potential in semiconductor and the movement of electrons generated in the photodiode (PD)

Note that the square figures illustrated directly above the potential in FIG. 8(a)(b)(c)(d) severally show the transfer gate (TG) 14, the sub gate (SG) 31 and the distribution gate (DG) (this means either the first distribution gate 15 or the second distribution gate 16), in which the state where the square is in outline indicates that the potential near substrate potential Vss is given, whereas the state where the square is painted out in black indicates that the positive potential is applied.

In the three stage gate structure where the sub gate (SG) 31 is provided between the transfer gate (TG) 14 being the front stage gate and the distribution gate (DG) being the rear stage gate (the first distribution gate (DG1) 15 and the second distribution gate (DG2)) according to the pixel structure 30, the voltage near the substrate potential Vss or the voltage Vtg is applied to the transfer gate (TG) 14, the voltage near the substrate potential Vss or the power source voltage Vdd is applied to the sub gate (SG), and the voltage near the substrate potential Vss or the voltage Vdg is applied to the distribution gate (DG).

The voltage Vtg and the voltage Vdg may be the same as the voltage in the case of the pixel structure 10 being the two-stage gate structure, but it is preferable to optimize the voltage by another method.

Specifically, since the voltage Vtg is desirably a voltage at which sufficient potential inclination can be formed to the power source voltage Vdd, about ½ the power source voltage Vdd is acceptable. Further, in the voltage Vdg, a voltage difference from the power source voltage Vdd is proportional to electron quantity that can be stored, so that it is desirably a voltage near the substrate potential Vss, but because potential inclination in electron movement should also be taken in consideration, it is desirable that the voltage be about ⅓ the power source voltage Vdd.

Specifically, when the power source voltage Vdd is 3.3V, for example, it is preferable to set the voltage Vtg to 1.8V and the voltage Vdg to 1.0V.

Herein, FIG. 8(a)(b)(c)(d) show the explanatory views of a method of moving electrons in four states in a potential similar to FIG. 3(a)(b)(c)(d) in the pixel structure 10 of the two stage gate structure.

A basic state is an electron storage state being a state where the potential near the substrate potential Vss is given to the transfer gate (TG) 14, the sub gate (SG) 31 and the distribution gate (DG), the photodiode (PD) 13 is reset to the voltage Vtg, and the power source voltage Vdd is reset to the charge-storage section (FD). FIG. 8(a) shows this basic state (storage).

When the pixel structure is exposed to light on the basic state shown in FIG. 8(a), photoelectrons are stored in the photodiode (PD) 13, and the potential of the photodiode (PD) 13 increases by a slight amount.

Figure 8B:
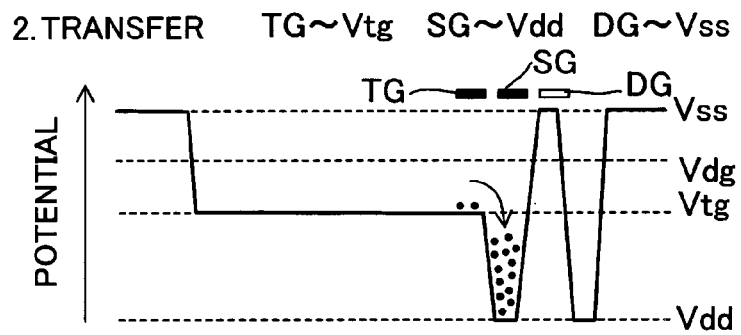

Next, when the voltage Vtg is applied to the transfer gate (TG) 14 and the power source voltage Vdd is applied to the sub gate (SG) 31, potential directly under the transfer gate (TG) 14 and the sub gate (SG) 31 is pushed down, and electrons move into a valley of potential created directly under the sub gate (SG) 31 as shown in FIG. 8(b) (transfer of electrons).

Figure 8C:
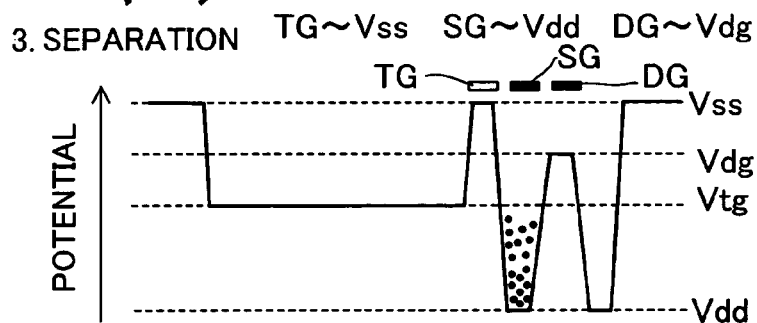

Next, when the potential near the substrate potential Vss is given to the transfer gate (TG) 14 to return the voltage, the power source voltage Vdd is left applied to the sub gate (SG) 31, and the voltage Vdg is applied to the distribution gate (DG), a wall of potential is created directly under the transfer gate (TG) 14 as shown in FIG. 8(c), and the photodiode (PD) 13 and the valley of potential created directly under the sub gate (SG) 31 are separated (separation). At this point, electrons cannot go out from the valley of potential directly under the sub gate (SG).

Figure 8D:
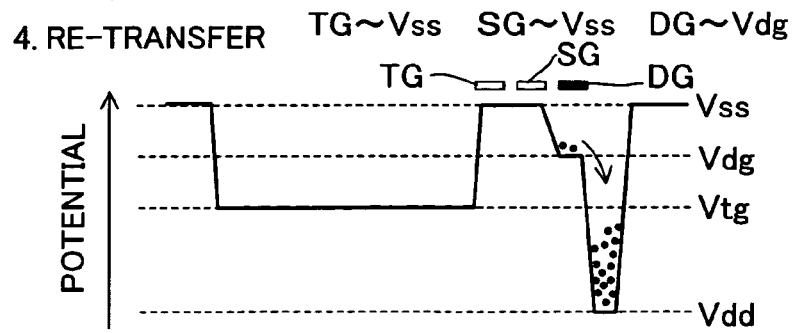

Next, when the voltage Vdg is kept on applying to the distribution gate (DG), and the potential near the substrate potential Vss is given to the sub gate (SG) 31 to return the voltage, the valley of potential created directly under the sub gate (SG) 31 disappears as shown in FIG. 8(d), so that electrons existed in the valley move to the channel on the distribution gate (DG) side having a low potential, electrons moved to the channel directly under the distribution gate (DG) do not stay but further move to the charge-storage section (FD) having a lower potential, and are stored in the charge-storage section (FD) (re-transfer).

As described above, electrons can also be completely transferred from the photodiode (PD) 13 to the charge-storage section (FD) even by the three stages of gates.

Although the embodiments shown in FIG. 7(a)(b) illustrated an arrangement of the two distribution gates (DG) and the two charge-storage sections (FD), they may be constituted such that the four distribution gates (DG) and the charge-storage section (FD) are arranged similar to constitution shown in FIG. 6.

3. Simulation Result

Next, description will be made for the result of simulation conducted by the present inventor referring to FIG. 9 and FIG. 10(a)(b)(c)(d).

Figure 9:
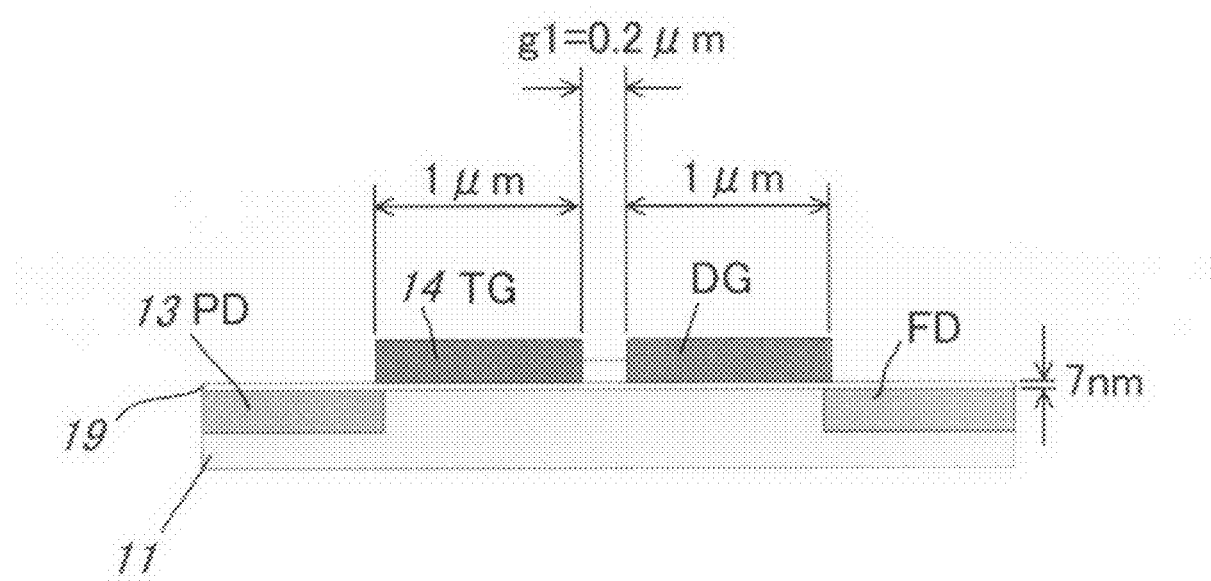
FIG. 9 is a cross-sectional constitution explanatory view schematically showing the cross-section of the pixel structure of a solid-state image sensor used in simulation.
Figure 10A:
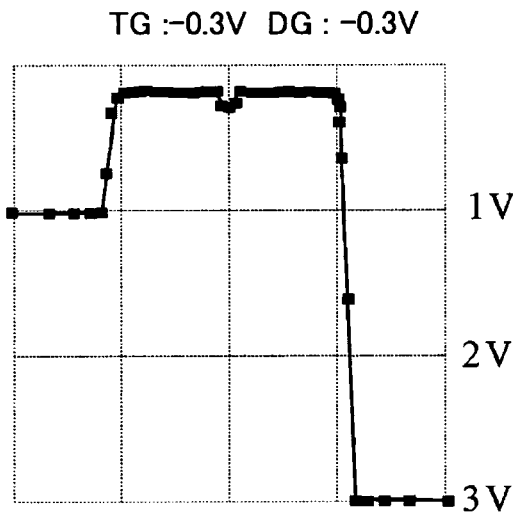
FIG. 10(a) is a simulation result corresponding to State 1 of FIG. 2(b)
Figure 10B:
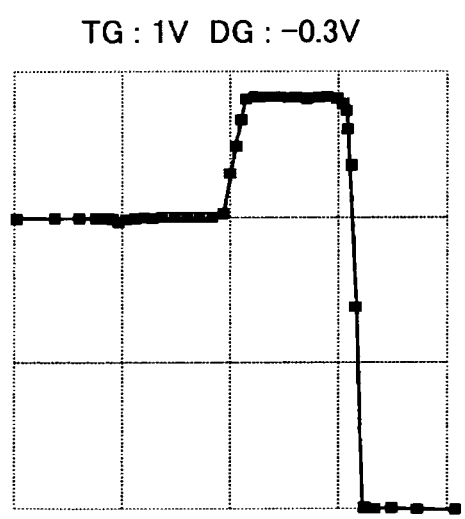
FIG. 10(b) is a simulation result corresponding to State 2 of FIG. 2(c)
Figure 10C:
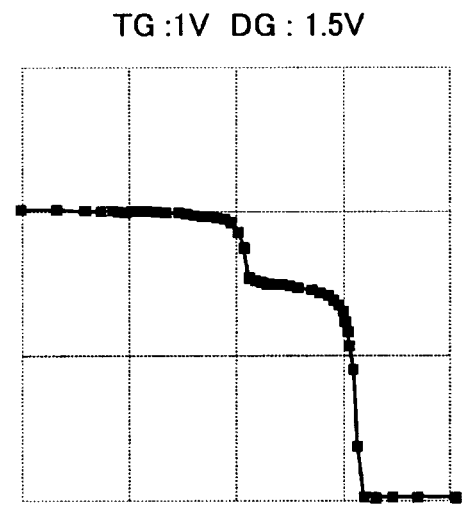
FIG. 10(c) is a simulation result corresponding to State 3 of FIG. 2(d)
Figure 10D:
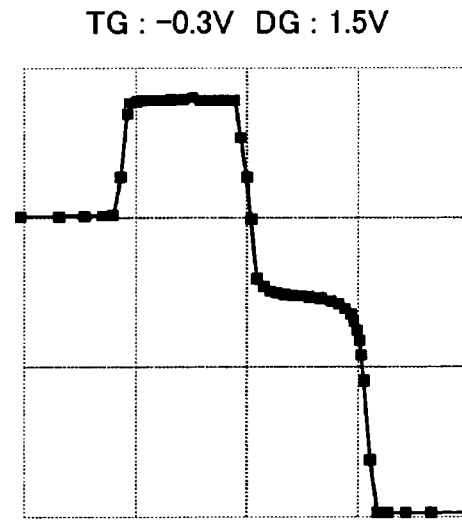
FIG. 10(d) is a simulation result corresponding to State 4 of FIG. 2(e)

In other words, FIG. 10(a)(b)(c)(d) show the results of surface potential simulation using a Poisson equation and an electron current continuity equation on the assumption that the pixel structure 10 by the present invention is manufactured by the conditions shown in FIG. 9.

Herein, the impurity concentration of a semiconductor substrate (P-type) as the substrate 11 was set to $2\times10^{15}$ with a cross-section shape shown in FIG. 9, and silicon oxide film being oxide film 19 was formed in the film thickness of 7 nm.

FIG. 10(*a*) is a simulation result corresponding to State 1 of FIG. 2(*b*), FIG. 10(*b*) is a simulation result corresponding to State 2 of FIG. 2(*c*), FIG. 10(*c*) is a simulation result corresponding to State 3 of FIG. 2(*d*), and FIG. 10(*d*) is a simulation result corresponding to State 4 of FIG. 2(*e*).

These simulation results basically approximate to the potential shapes schematically illustrated in FIG. 2(*b*)(*c*)(*d*)(*e*), and it is understood that electrons stored in the photodiode (PD) 13 will move to the charge-storage section (FD) so as to drop staircases in the state shown in FIG. 10(*d*) where the positive voltage is applied to the transfer gate (TG) 14 and the distribution gate (DG).

4. Characteristics in Working-Effect of the First Embodiment (Two-Stage Gate Structure) and the Second Embodiment (Three-Stage Gate Structure)

(1) Merits of the First Embodiment (Two-Stage Gate Structure)

a. Simple structure comparing to the three-stage gate structure b. Area of photodiode (PD) can be made wider than that of the three-stage gate structure when arranging pixels of the same size.

(2) Merits of the Second Embodiment (Three-Stage Gate Structure)

a. Transfer is conducted more completely because potential gradient can be made larger than that of the two-stage gate structure.

b. Depletion layer can be made thicker because reverse bias voltage of photodiode (PD) can be taken deeper than that of the two-stage gate structure.

Therefore, it is perceived from the characteristics described above that the two stage gate structure such as the pixel structure 10 of the first embodiment is advantageous in the application of a small pixel pitch, and the three stage gate structure such as the pixel structure 30 of the second embodiment is advantageous in the application of a large pixel pitch.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2007-181696 filed on Jul. 11, 2007 including specification, claims, drawings and summary are incorporated herein by reference in its entirety.

What is claimed is:

1. A pixel structure of a solid-state image sensor, which performs charge storage while distributing electrons generated by photoelectric conversion, said structure comprising:
    a plurality of photodiodes that generate electrons by photoelectric conversion;
    a plurality of charge-storage sections that store electrons generated in each of the plurality of photodiodes wherein at least two of said plurality of charge storage sections are arranged to store electrons generated by each photodiode; and
    a gate structure that is arranged adjacently between each photodiode and said plurality of charge-storage sections and controls transfer of electrons generated in said photodiode to said plurality of charge-storage sections,
    wherein said gate structure is made up of plural stages of gates, and
    said plural stages of gates comprise:
    a front stage gate that is arranged adjacent to said photodiode and controls readout of electrons generated in said photodiode; and
    a plurality of rear stage gates, each of which is arranged adjacent to each of said plurality of charge-storage sections on a rear side of said front stage gate, respectively, and performs control of distributing electrons read out by the front stage gate readout control to each of said plurality of charge-storage sections, respectively.

2. A pixel structure of a solid-state image sensor that performs charge storage while distributing electrons generated by photoelectric conversion, said structure comprising:
    a plurality of photodiodes that generate electrons by photoelectric conversion;
    a plurality of charge-storage sections that store electrons generated in each of the plurality of photodiodes wherein at least two of said plurality of charge storage sections are arranged to store electrons generated by each photodiode; and
    a gate structure that is arranged adjacently between each photodiode and said plurality of charge-storage sections and controls transfer of electrons generated in said photodiode to said plurality of charge-storage sections,
    wherein said gate structure is made up of two stages of gates, and said two stages of gates comprise:
    a first stage gate arranged adjacent to said photodiode and controls readout of electrons generated in said photodiode; and
    a plurality of second stage gates, each of which is arranged adjacent to said first stage gate with a predetermined gap between the first stage gate and each of said plurality of charge-storage sections, and each of which performs control of distributing electrons read out by the first stage gate readout control to said plurality of charge-storage sections, respectively.

3. A solid-state image sensor structure that performs charge storage while distributing electrons generated by photoelectric conversion, said structure comprising:
    a plurality of photodiodes that generate electrons by photoelectric conversion;
    a plurality of charge-storage sections that store electrons generated in each of the plurality of photodiodes, wherein at least two of said plurality of charge storage sections are arranged to store electrons generated by each photodiode; and
    a gate structure that is arranged adjacently between each photodiode and said plurality of charge-storage sections and controls transfer of electrons generated in each photodiode to said plurality of charge-storage sections,
    wherein said gate structure is made up of three stages of gates, comprise:
    a first stage gate, which is arranged adjacent to said photodiode and controls readout of electrons generated in said photodiode;
    a second stage gate that is arranged adjacent to said first stage gate with a predetermined gap, and between said first stage gate and said plurality of charge storage sections, and which controls movement of electrons read out by the first stage gate readout control to said plurality of charge-storage sections; and a plurality of third stage gates, each of which is arranged adjacent to said second stage gate with a predetermined gap, and is arranged corresponding to each of said plurality of charge-storage sections, respectively, and which perform control of distributing electrons moved by movement control of said second stage gate to said plurality of charge-storage sections, respectively.

4. A solid-state image sensor structure, which performs charge storage while distributing electrons generated by photoelectric conversion, said structure comprising:

a plurality of photodiodes that generate electrons by photoelectric conversion;

a plurality of charge-storage sections that store electrons generated in each of the plurality of photodiodes, wherein at least two of said plurality of charge storage sections are arranged to store electrons generated by each photodiode; and a gate structure that is arranged adjacently between each photodiode and said plurality of charge-storage sections and controls transfer of electrons generated in each photodiode to said plurality of charge-storage sections, wherein said gate structure is made up of plural stages of gates, and said plural stages of gates at least have:

one front stage gate that is arranged adjacent to said photodiode and controls readout of electrons generated in said photodiode; and another stage gate that is arranged adjacent to said plurality of charge-storage sections on a side of said front stage gate, and comprises a plurality of gates, each of which is arranged adjacent to said front stage gate with a predetermined gap, corresponding to each of said plurality of charge-storage sections, respectively and which perform control of distributing electrons read out by a front stage gate readout control to said plurality of charge-storage sections, respectively.

* * * * *